(12) United States Patent
Chang et al.

(10) Patent No.: US 10,176,999 B2
(45) Date of Patent: Jan. 8, 2019

(54) SEMICONDUCTOR DEVICE HAVING A MULTI-LAYER, METAL-CONTAINING FILM

(71) Applicant: TAIWAN SEMICONDUCTOR MANUFACTURING COMPANY LTD., Hsinchu (TW)

(72) Inventors: Yao-Wen Chang, Taipei (TW); Jian-Shiou Huang, Pingtung County (TW); Cheng-Yuan Tsai, Hsin-Chu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 13 days.

(21) Appl. No.: 15/147,646

(22) Filed: May 5, 2016

(65) Prior Publication Data

US 2017/0194152 A1 Jul. 6, 2017

Related U.S. Application Data

(60) Provisional application No. 62/273,723, filed on Dec. 31, 2015.

(51) Int. Cl.
| | |
|---|---|
| *H01L 21/285* | (2006.01) |
| *H01L 29/45* | (2006.01) |
| *H01L 29/06* | (2006.01) |
| *H01L 23/532* | (2006.01) |
| *H01L 21/768* | (2006.01) |

(52) U.S. Cl.
CPC .... *H01L 21/2855* (2013.01); *H01L 21/76852* (2013.01); *H01L 23/53223* (2013.01); *H01L 23/53238* (2013.01); *H01L 29/0642* (2013.01); *H01L 29/0692* (2013.01); *H01L 29/456* (2013.01)

(58) Field of Classification Search
CPC ..... H01L 23/564; H01L 21/02; H01L 23/532; H01L 23/53238
See application file for complete search history.

(56) References Cited

U.S. PATENT DOCUMENTS 5,892,281 A * 4/1999 Akram .............. H01L 21/76843
257/750
7,071,100 B2 * 7/2006 Chen ................. H01L 21/76807
257/E21.579

(Continued)

FOREIGN PATENT DOCUMENTS

TW 201504041 2/2015

*Primary Examiner* — Michael Lebentritt
*Assistant Examiner* — Suberr Chi
(74) *Attorney, Agent, or Firm* — Haynes and Boone, LLP

(57) ABSTRACT

A film stack and manufacturing method thereof are provided. The film stack includes a plurality of first metal-containing films, and a plurality of second metal-containing films. The first metal-containing films and the second metal-containing films are alternately stacked to each other. The first metal-containing films and the second metal-containing films comprise the same metal element and the same nonmetal element, and a concentration of the metal element in the second metal-containing film is greater than a concentration of the nonmetal element in the second metal-containing film.

20 Claims, 12 Drawing Sheets

(56) References Cited

U.S. PATENT DOCUMENTS

| | | | |
|---|---|---|---|
| 2010/0044869 A1* | 2/2010 | Zhang | H01L 21/76829 257/773 |
| 2014/0264867 A1* | 9/2014 | Kuo | H01L 23/53238 257/751 |
| 2016/0107928 A1 | 4/2016 | Bayne et al. | |
| 2016/0126183 A1* | 5/2016 | Chen | H01L 23/5226 257/774 |

* cited by examiner

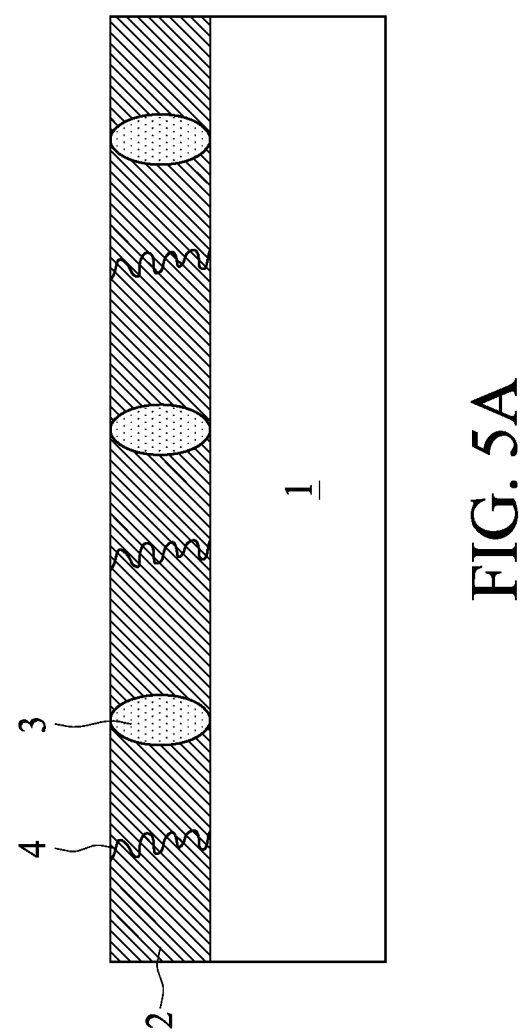

SEMICONDUCTOR DEVICE HAVING A MULTI-LAYER, METAL-CONTAINING FILM

CROSS-REFERENCE TO RELATED APPLICATION

This application claims priority of U.S. provisional application Ser. No. 62/273,723 filed on 2015 Dec. 31, which is incorporated by reference in its entirety.

BACKGROUND

Tantalum nitride (TaN) film has been commonly used in semiconductor industry due to its anti-diffusion and anti-corrosion capability. However, intrinsically large compressive stress and brittle property of tantalum nitride film lead to peeling problem and particle issue, which needs to be addressed.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 5A is a schematic diagram illustrating a metal-nonmetal compound film formed over a substrate.

DETAILED DESCRIPTION

Figure 1:
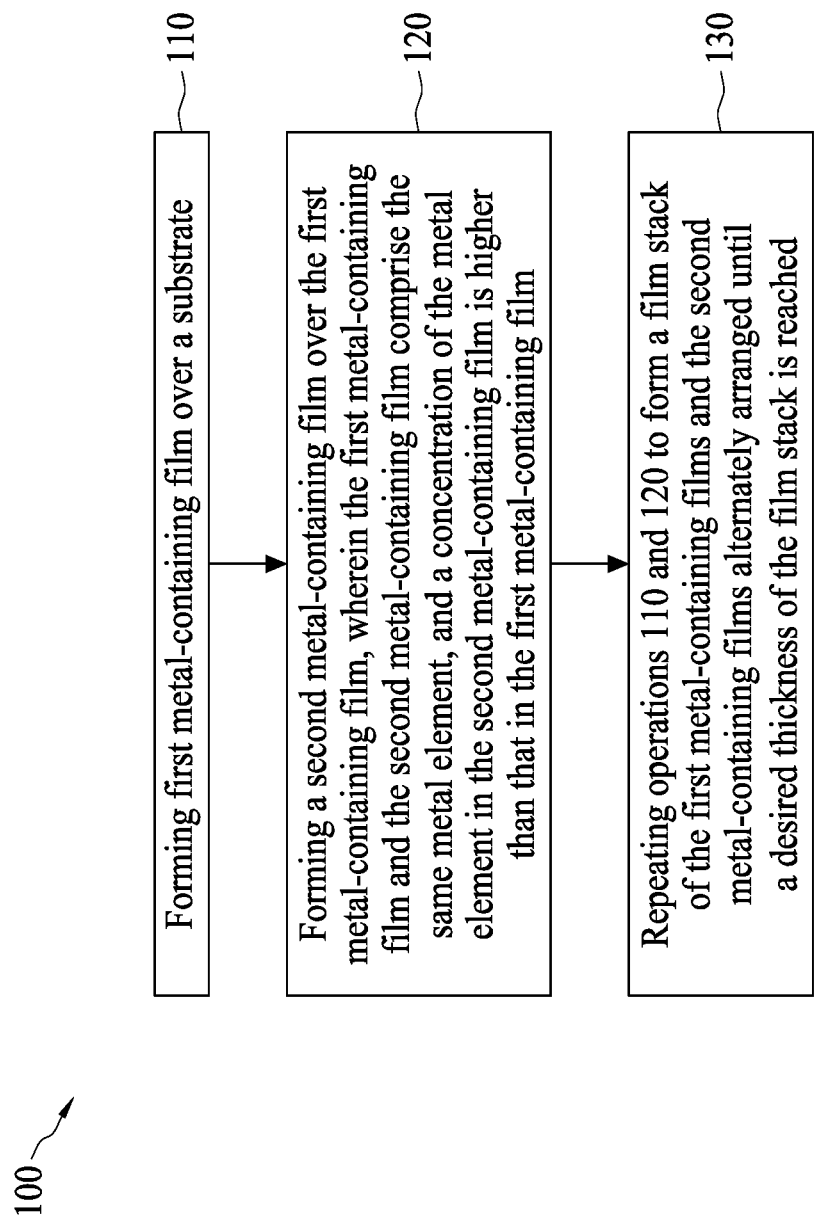
FIG. 1 is a flow diagram illustrating a method for forming a film stack on a substrate according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first" and "second" when used herein do not imply a sequence or order unless clearly indicated by the context.

As used herein, the term "metal-containing film" is referred to a metal film, a metal-nonmetal compound film, an alloy film or any other film comprising metallic material. The first metal-containing film and the second metal-containing film comprise the same metal element(s), and the concentration of the metal element in the second metal-containing film is higher than the concentration of the metal element in the first metal-containing film. In the context, the term "first metal-containing film" and the term "metal-nonmetal compound film" (or "metal-deficient metal-nonmetal compound film") are interchangeable, and the term "second metal-containing film" and the term "metal-rich metal-nonmetal compound film" are interchangeable.

As used herein, the terms "metal-rich metal-nonmetal compound film" and "metal-nonmetal compound film" are referred to as two metal-nonmetal compound film having substantially the same metal and nonmetal components but with different ratios. In some embodiments, the concentration of metal component in metal-rich metal-nonmetal compound film is relatively higher than that in metal-nonmetal compound film. In some embodiments, the concentration of metal element is higher than the concentration of nonmetal element in metal-rich metal-nonmetal compound film. Compared with metal-rich metal-nonmetal compound film, metal-nonmetal compound film may also be referred to as metal-deficient metal-nonmetal compound film.

In the present disclosure, a multi-layered film (also referred to as a film stack) is formed by alternately stacking metal-nonmetal compound films and metal-rich metal-nonmetal compound films. In some embodiments, the multi-layered film is configured to provide pasting effect to preventing particles from falling. In some embodiments, the multi-layered film is configured to reduce stress to avoid peeling. In some embodiments, the multi-layered film is configured to reduce resistance to enhance electric characteristic, and to improve barrier and protection effect.

FIG. 1 is a flow diagram illustrating a method for forming a film stack on a substrate according to some embodiments of the present disclosure. The method 100 begins with operation 110, in which a first metal-containing film is formed over the substrate. The method 100 proceeds with operation 120, in which a second metal-containing film is formed over the first metal-containing film. The first metal-containing film and the second metal-containing film comprise the same metal element, and a concentration of the metal element in the second metal-containing film is higher than that in the first metal-containing film. The method 100 continues with operation 130 by repeating operations 110 and 120 to form a film stack of the first metal-containing films and the second metal-containing films alternately arranged until a desired thickness of the film stack is reached.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

In some embodiments, the first metal-containing film and the second metal-containing film include the same metal element and nonmetal element, but are different in proportion. The concentration of the metal element in the second metal-containing film is greater than the concentration of the nonmetal element in the second metal-containing film. The concentration of the metal element in the first metal-containing film is substantially equal to or less than the concentration of the nonmetal element in the first metal-containing film. In some embodiments, the concentration of the metal element in the second metal-containing film is greater than 50%. In some embodiments, the concentration of the metal element in the second metal-containing film is greater than 55%. In some embodiments, the concentration of the metal element in the second metal-containing film is greater than 60%. In some embodiments, the concentration of the metal element in the second metal-containing film is greater than 75%. In some embodiments, the concentration of the metal element in the first metal-containing film is less than or substantially equal to 50%.

Figure 2:
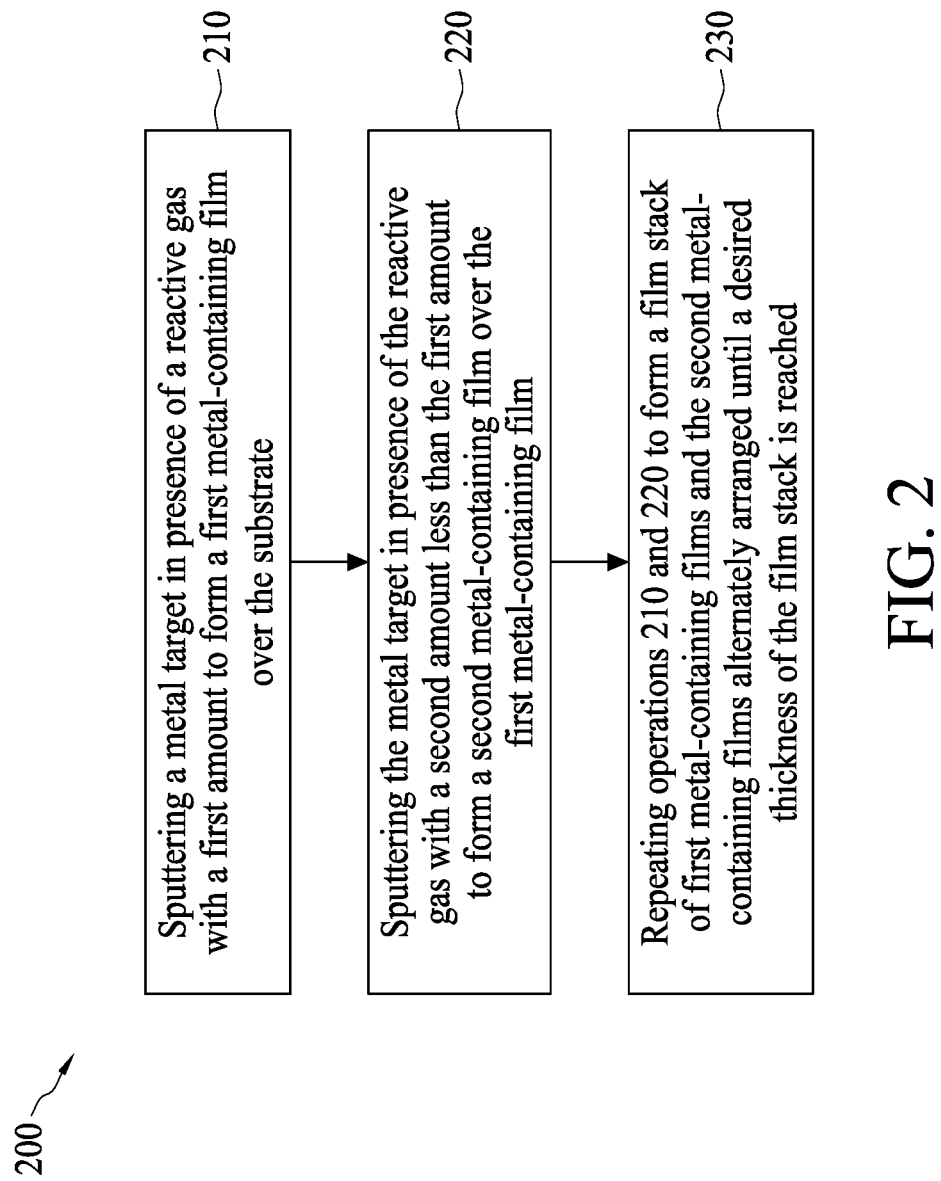
FIG. 2 is a flow diagram illustrating a method for forming a film stack on a substrate according to some exemplary embodiments of the present disclosure.

FIG. 2 is a flow diagram illustrating a method for forming a film stack on a substrate according to some exemplary embodiments of the present disclosure. The method 200 begins with operation 210 by sputtering a metal target in presence of a reactive gas with a first amount to form a first metal-containing film over the substrate. The method 200 continues with operation 220 by sputtering the metal target in presence of the reactive gas with a second amount less than the first amount to form a second metal-containing film over the first metal-containing film. The method 200 continues with operation 230 by repeating operations 210 and 220 to form a film stack of the first metal-containing films and the second metal-containing films alternately arranged until a desired thickness of the film stack is reached.

In some embodiments, the metal-nonmetal compound films and the metal-rich metal-nonmetal compound films are, but not limited to be, manufactured by physical vapor deposition (PVD) such as sputtering. In some exemplary embodiments, the substrate is loaded into a PVD reaction chamber. In operation 210, a bias voltage is supplied, and a metal target is sputtered in presence of the reactive gas with a first amount to form the metal-nonmetal compound film. In operation 220, the metal target is sputtered again under the bias voltage, but the reactive gas with a second amount less than the first amount is introduced into the reaction chamber. The ratio of metal element to nonmetal element in the metal-nonmetal compound film or in the metal-rich metal-nonmetal compound film can be adjusted by individually controlling the amount of the reactive gas or other parameters of the sputtering operation. In some exemplary embodiments, the amount of reactive gas is modified by controlling the time duration of introducing the reactive gas. For example, the time of introducing the reactive gas in operation 220 is shorter than that in operation 210. In some embodiments, the amount of reactive gas may be adjusted by modifying other parameter such as flow rate or proportion of reactive gas introduced to the reaction chamber.

The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

Figure 3:
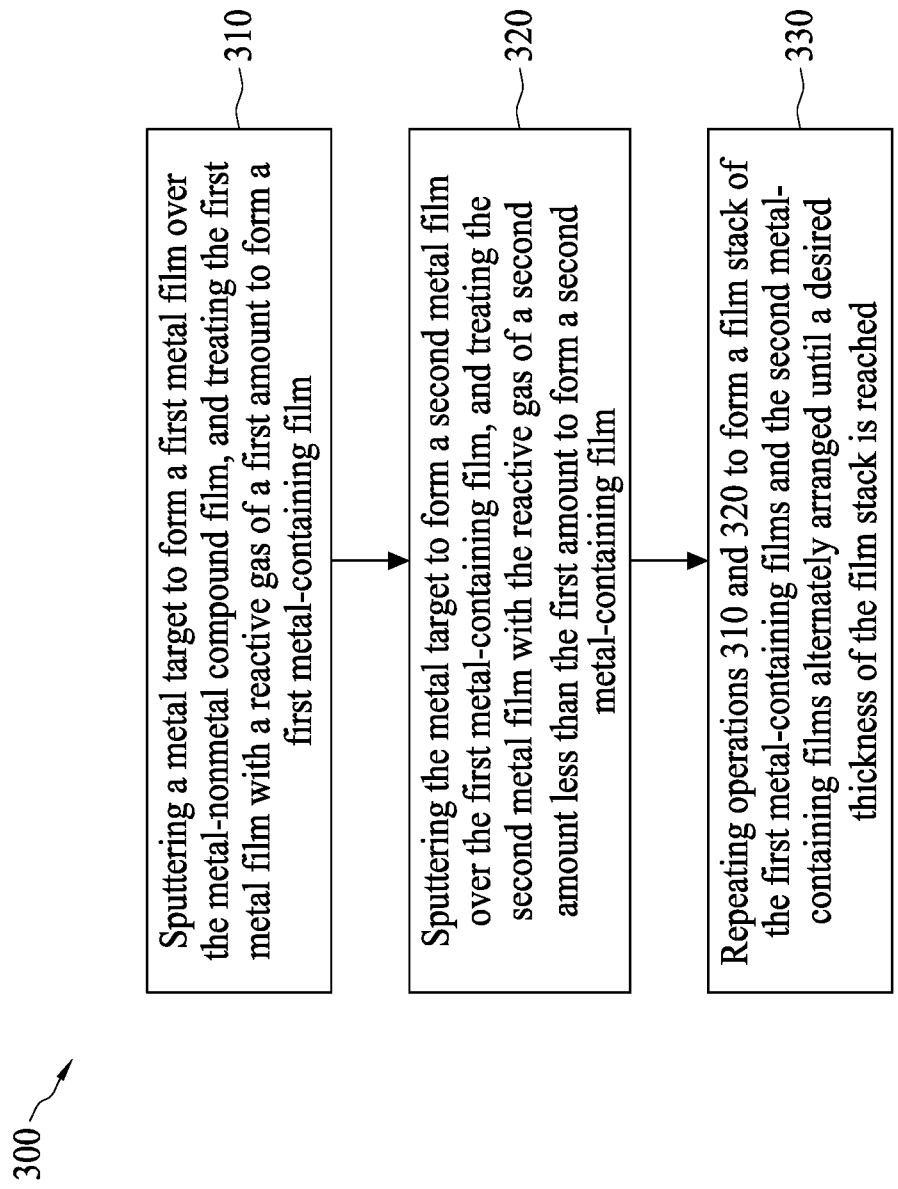
FIG. 3 is a flow diagram illustrating a method for forming a film stack on a substrate according to some exemplary embodiments of the present disclosure.

FIG. 3 is a flow diagram illustrating a method for forming a film stack on a substrate according to some exemplary embodiments of the present disclosure. The method 300 begins with operation 310, in by sputtering a metal target to form a first metal film, and then treating the first metal film with a reactive gas of a first amount to form the first metal-containing film. The method 300 continues with operation 320 by sputtering the metal target to form a second metal film over the first metal-containing film, and then treating the second metal film with the reactive gas of a second amount less than the first amount to form the second metal-containing film. The method 300 continues with operation 330 by repeating operations 310 and 320 to form a film stack of the first metal-containing films and the second metal-containing films alternately arranged until a desired thickness of the film stack is reached.

The method 300 is merely an example, and is not intended to limit the present disclosure beyond what is explicitly recited in the claims. Additional operations can be provided before, during, and after the method 300, and some operations described can be replaced, eliminated, or moved around for additional embodiments of the method.

In some embodiments, the metal target comprises a tantalum target, and the reactive gas comprises nitrogen gas. Accordingly, the metal-nonmetal compound film is tantalum nitride film, and the metal-rich metal-nonmetal compound film is tantalum-rich tantalum nitride film. In some embodiments, the metal target comprises a tantalum target, and the reactive gas comprises oxygen gas. Accordingly, the metal-nonmetal compound film is tantalum oxide film, and the metal-rich metal-nonmetal compound film is tantalum-rich tantalum oxide film. In some other embodiments, the metal-nonmetal compound film and the metal-rich metal-nonmetal compound film may include other metal and nonmetal elements.

In some embodiments, the desired thickness of the film stack is greater than 1200 angstroms. In some embodiments, the desired thickness of the film stack is greater than 1800 angstroms. In some embodiments, the desired thickness of the film stack is greater than 2000 angstroms. In some embodiments, the desired thickness of the film stack is greater than 3000 angstroms.

In some alternative embodiments, the second metal-containing films may be metal films. That is, the film stack may include metal films and metal-nonmetal compound films alternately arranged. The film stack of metal films and metal-nonmetal compound films may be formed in various manners. In some embodiments, the metal film is formed by sputtering a metal target in absence of reactive gas. The metal-nonmetal compound film may be formed by sputtering the metal target in presence of reactive gas. In some other embodiments, the metal-nonmetal compound film may be formed by sputtering the metal target in absence of reactive gas to form a metal film, and then treating the metal film with reactive gas.

Figure 4A:
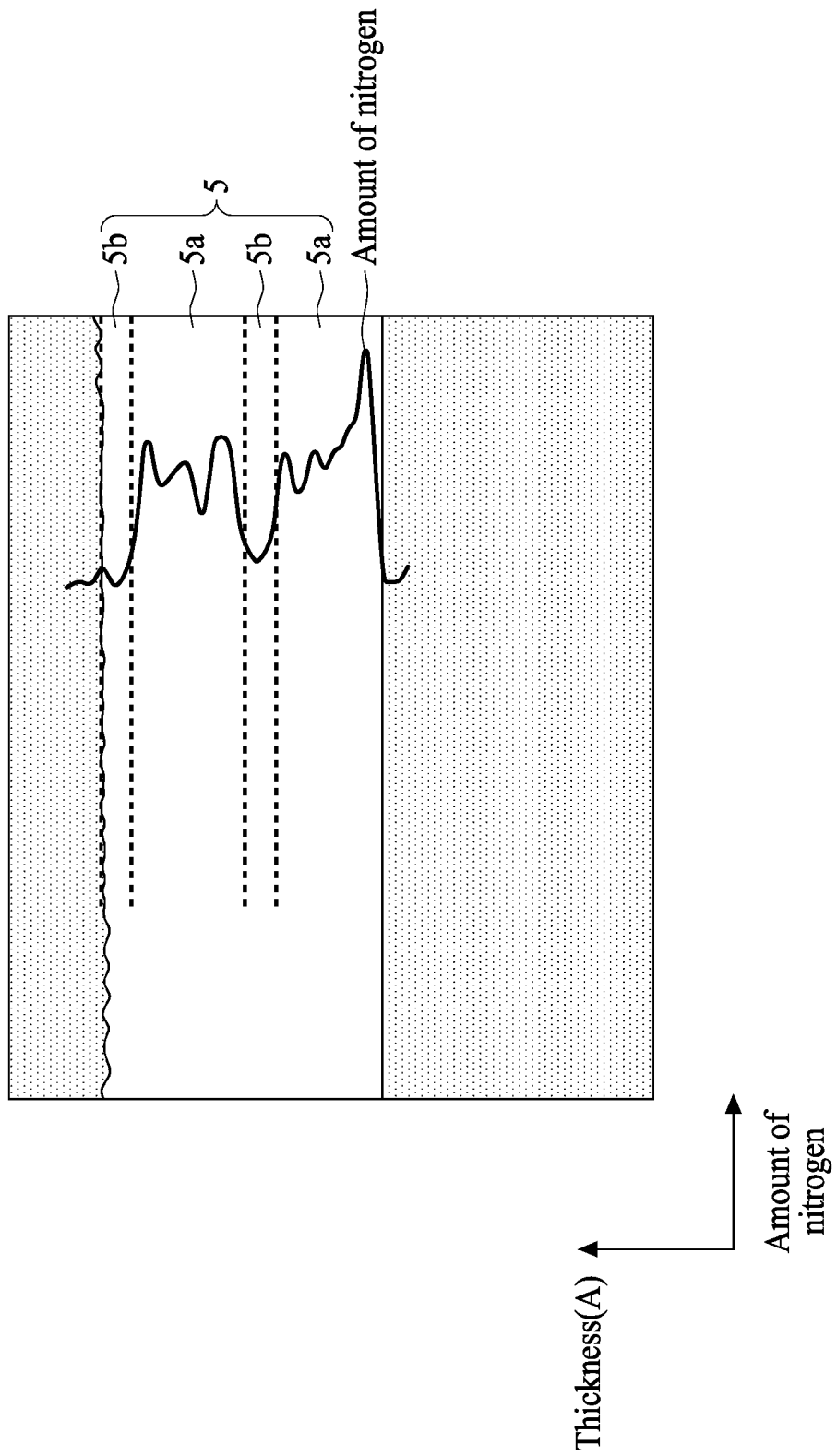
FIG. 4A is an EDS (energy dispersive spectroscopy) illustrating a film stack of tantalum nitride layers and tantalum-rich tantalum nitride layers according to some embodiments of the present disclosure.
Figure 4B:
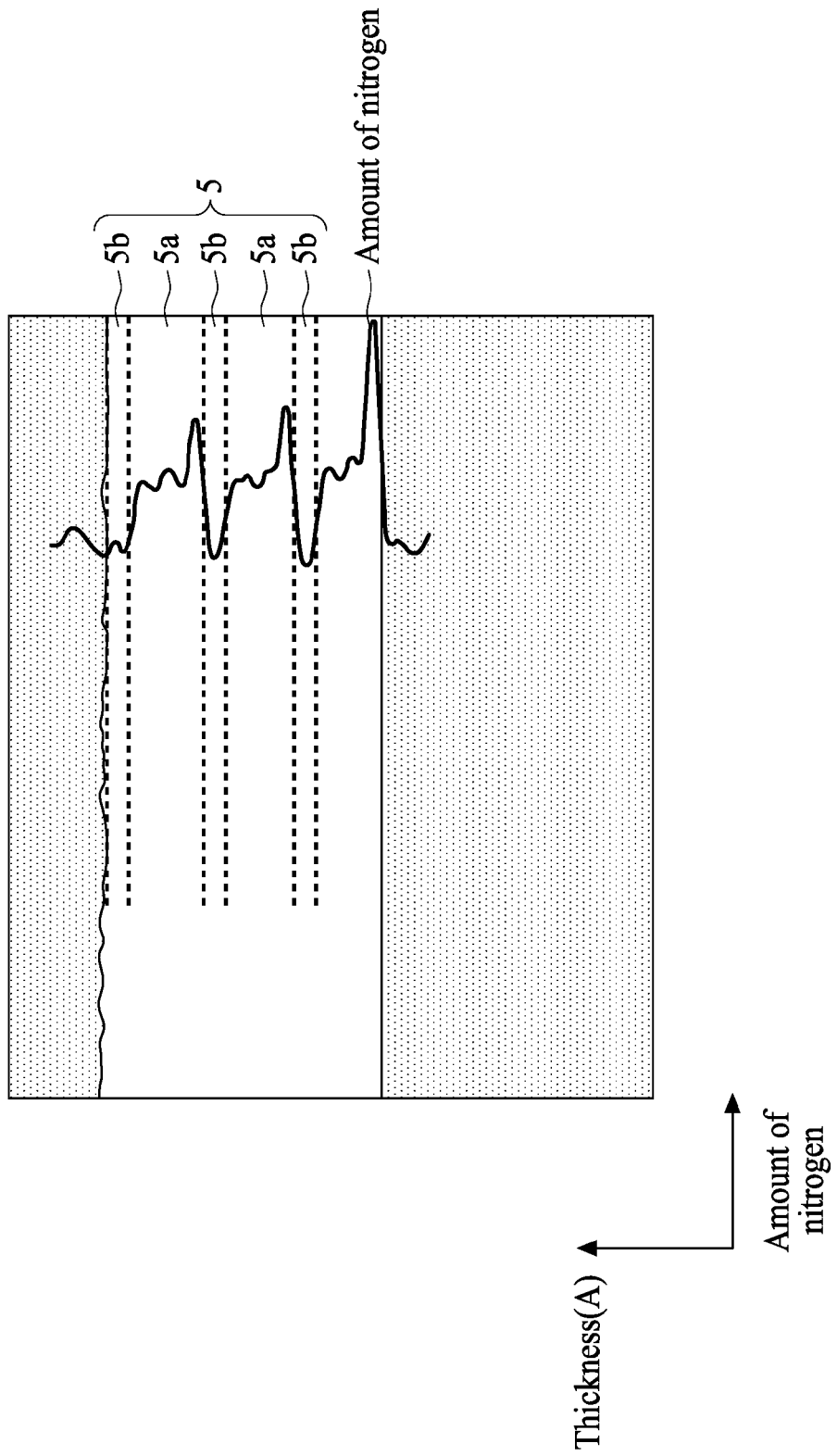
FIG. 4B is an EDS illustrating a film stack of tantalum nitride layers and tantalum-rich tantalum nitride layers according to some other embodiments of the present disclosure.

FIG. 4A is an EDS (energy dispersive spectroscopy) illustrating a film stack of tantalum nitride layers and tantalum-rich tantalum nitride layers according to some embodiments of the present disclosure, and FIG. 4B is an EDS illustrating a film stack of tantalum nitride layers and tantalum-rich tantalum nitride layers according to some other embodiments of the present disclosure. As depicted in FIG. 4A, the film stack 5 includes two tantalum nitride layers 5a and two tantalum-rich tantalum nitride layers 5b alternately formed. In the present embodiment, the overall thickness of the film stack 5 is about 2000 angstroms, and the thickness of a tantalum nitride layer 5a and a tantalum-rich tantalum nitride layer 5b is about 1000 angstroms. In some embodiments, the thickness ratio of the tantalum-rich tantalum nitride layer 5b to the tantalum nitride layer 5a is about 1:4. The thickness ratio of the tantalum-rich tantalum nitride layer 5b to the tantalum nitride layer 5a, may be modified, for example, by adjusting the time duration of operations 210 and 220 in FIG. 2, or by adjusting the amount of reactive gas in the treatment of operations 310 and 320. As depicted in FIG. 4B, the film stack 5 includes three tantalum nitride layers 5a and three tantalum-rich tantalum nitride layers 5b alternately formed. In the present embodiment, the overall thickness of the film stack 5 is about 1800 angstroms, and the thickness of a tantalum nitride layer 5a and a tantalum-rich tantalum nitride layer 5b is about 600 angstroms. In some embodiments, the thickness ratio of the tantalum-rich tantalum nitride layer 5b to the tantalum nitride layer 5a is about 1:3.

As shown in FIGS. 4A and 4B, the EDS analysis shows clear peaks and valleys, which means the film stack comprising the metal-nonmetal compound films and the metal-rich metal-nonmetal compound films can be manufactured by the aforementioned method disclosed in FIGS. 1-3.

It is appreciated that the number and thickness of the metal-nonmetal compound films and the metal-rich metal-nonmetal compound films are not limited by the aforementioned embodiments, and may be modified based on desired requirement and specification.

Metal-nonmetal compound film such as tantalum nitride film or tantalum oxide film is used as a protection layer and a barrier layer due to its anti-diffusion and anti-corrosion capability. Metal-nonmetal compound film, however, is suffered from peeling problem and particle issue, especially when a thick film thickness is required in some applications. The film stack of the metal-nonmetal compound films and the metal-rich metal-nonmetal compound films is configured as a thick protection layer or barrier layer without suffering from peeling problem and particle issue.

In addition to alleviating peeling problem and particle issue, the film stack of metal-nonmetal compound films and metal-rich metal-nonmetal compound films is also able to reduce stress. Moreover, the film stack of metal-nonmetal compound films and metal-rich metal-nonmetal compound films is capable of reducing resistance. Compared with a thick metal-nonmetal compound layer, the film stack of metal-nonmetal compound films and metal-rich metal-nonmetal compound films has lower resistance, resulting in improvement of electric characteristic.

FIG. 5A is a schematic diagram illustrating a metal-nonmetal compound film formed over a substrate. As depicted in FIG. 5A, a metal-nonmetal compound film 2 is formed on a substrate 1. As the thickness increases, inherent pinholes 3 or grain boundaries 4 tend to propagate along the thickness direction of the metal-nonmetal compound film 2, which would lead to peeling. In addition, the propagating pinholes 3 and grain boundaries 4 affect the anti-diffusion and anti-corrosion capability of the metal-nonmetal compound film 2 when configured as a barrier layer and a protection layer. Also, the particle issue gets serious when the thickness of the metal-nonmetal compound film 2 increases to about 1200 angstroms or higher. The particle issue is expected to be resulted from particles falling from the reaction chamber wall during operation since metal-nonmetal compound film 2 such as tantalum nitride has intrinsically large compressive stress and brittle property.

Figure 5B:
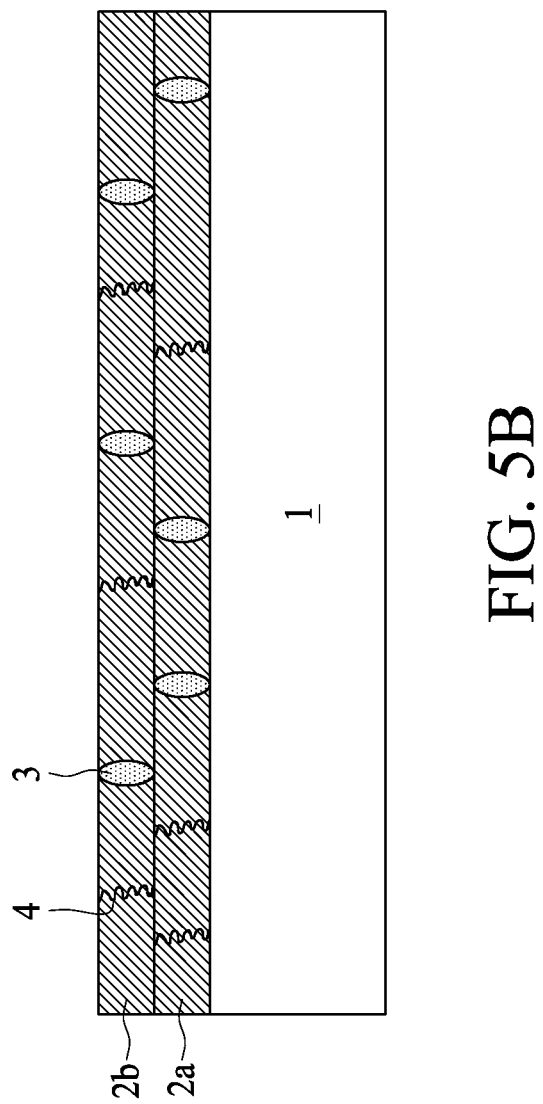
FIG. 5B is a schematic diagram illustrating a film stack of metal-nonmetal compound film and metal-rich metal-nonmetal compound film formed on a substrate.

FIG. 5B is a schematic diagram illustrating a film stack of metal-nonmetal compound film and metal-rich metal-nonmetal compound film formed on a substrate. As depicted in FIG. 5B, the film stack of metal-nonmetal compound film 2a and metal-rich metal-nonmetal compound film 2b is configured to block propagation path of pinholes 3 and grain boundaries 4. Specifically, the propagation path of pinholes 3 and grain boundaries 4 are blocked at the interface between the metal-nonmetal compound film 2a and the metal-rich metal-nonmetal compound film 2b. As such, the barrier and protection effect of the film stack of metal-nonmetal compound film 2a and metal-rich metal-nonmetal compound film 2b is more reliable. Also, peeling issue is alleviated.

The metal-rich metal-nonmetal compound film is also configured as a pasting layer to alleviate particle issue. Specifically, as the metal-nonmetal compound film 2a and the metal-rich metal-nonmetal compound film 2b are alternately stacked on the substrate 1, the metal-nonmetal compound film 2a and the metal-rich metal-nonmetal compound film 2b are as well formed on the reaction chamber wall. The metal-rich metal-nonmetal compound film 2b on the reaction chamber wall is able to paste the particles of the brittle metal-nonmetal compound film 2a, thereby reducing particles falling from the reaction chamber wall. Accordingly, particle issue is alleviated, particularly when the thickness of the film stack exceeds 1200 angstroms.

Figure 6:
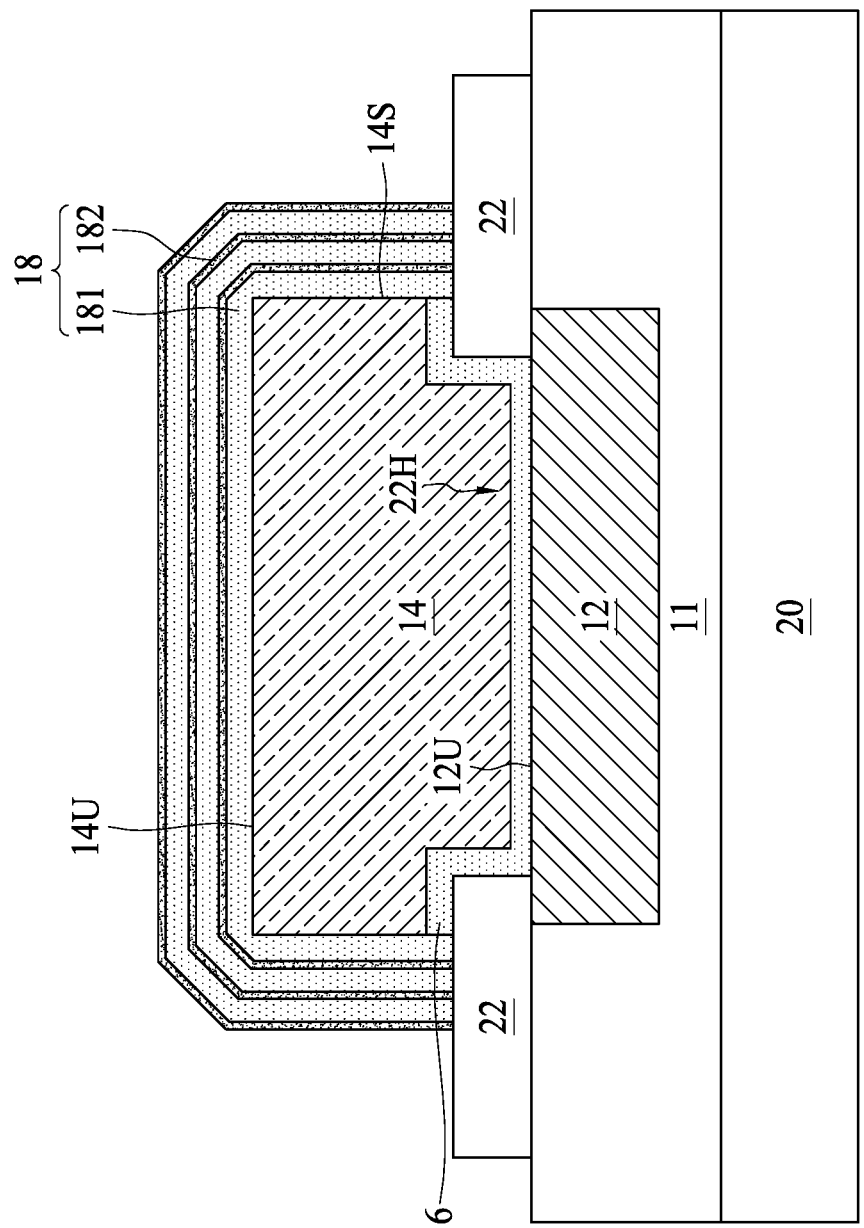
FIG. 6 is a schematic diagram illustrating a semiconductor device according to some embodiments of the present disclosure.

FIG. 6 is a schematic diagram illustrating a semiconductor device according to some embodiments of the present disclosure. As depicted in FIG. 6, the semiconductor device 10 includes a substrate 20, an inter-metal dielectric (IMD) layer 11, a first conductive layer 12, a passivation layer 22, a second conductive layer 14, a barrier layer 16 and a multi-layered film 18. The substrate 20 includes a semiconductor substrate or a wafer over which devices such as semiconductor devices and other active or passive devices are to be formed. In some embodiments, the substrate 20 includes a semiconductor substrate, such as a bulk semiconductor substrate. The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate 20 includes a multilayered substrate, such as a silicon-on-insulator (SOI) substrate, which includes a bottom semiconductor layer, a buried oxide layer (BOX) and a top semiconductor layer.

In some embodiments, the IMD layer 11 is a topmost IMD layer, and the first conductive layer 12 is a topmost metallization layer of an interconnection layer. The first conductive layer 12 is formed over the substrate 20 and a portion of the first conductive layer 12 is exposed by the IMD layer 11. The first conductive layer 12 may be treated by a planarization operation such as a chemical mechanical polishing (CMP), resulting in a planarized surface substantially planar with the IMD layer 11. The material of the first conductive layer 12 may include, but is not limited to, for example copper, copper alloy, or copper-based conductive materials. In some embodiments, the IMD layer 11 is a low-k dielectric layer with a dielectric constant less than about 3.9. For example, the material of the IMD layer 11 may include, but is not limited to, silicon oxide, silicon nitride, silicon oxynitride, phosphosilicate glass (PSG), Borophosphosilicate glass (BPSG), fluorine-containing silicon oxide, or other suitable inorganic and/or organic dielectric materials.

In some embodiments, the passivation layer 22 is formed over the IMD layer 11 to protect the first conductive layer 12. The passivation layer 22 has an opening 22H exposing at least a portion of an upper surface 12U of the first conductive layer 12. The material of the passivation layer 22 may include, but is not limited to, silicon oxide such as TEOS oxide, silicon nitride, or any other suitable insulative materials.

The second conductive layer 14 is formed over and electrically connected to the first conductive layer 12. In some embodiments, the material of the second conductive layer 14 may include aluminum copper, but not limited thereto. The material of the second conductive layer 14 may include copper, or any other suitable conductive materials. In some embodiments, the surface 14U of the second conductive layer 14 is substantially planar.

The barrier layer 16 is formed between the first conductive layer 12 and the second conductive layer 14. The barrier layer 16 is configured as a diffusion barrier to prevent diffusion from the first conductive layer 12. The barrier layer 16 may also be configured to enhance adhesion between the first conductive layer 12 and the second conductive layer 14, and also configured as a stress buffering layer. The barrier layer 16 may be single-layered or multi-layered. In some embodiments, the barrier layer 16 is conductive. In some embodiments, the material of the barrier layer 16 may include, but is not limited to, tantalum, titanium, tantalum nitride, titanium nitride, tungsten, a combination thereof, or any other suitable conductive and barrier materials. In some embodiments, the barrier layer 16 is substantially conformal, and filled in the opening 22H of the passivation layer 22.

The multi-layered film 18 includes a plurality of metal-nonmetal compound films 181 and metal-rich metal-nonmetal compound films 182 alternately arranged and stacked to each other. In some embodiments, the metal-nonmetal compound film 181 is a metal nitride film, and the metal-rich metal-nonmetal compound film 182 is a metal-rich metal nitride film. By way of an example, the metal-nonmetal compound film 181 is a tantalum nitride film, and the metal-rich metal-nonmetal compound film 182 is a tantalum-rich tantalum nitride film. In some other embodiments, the metal-nonmetal compound film 181 is a metal oxide film, and the metal-rich metal-nonmetal compound film 182 is a metal-rich metal oxide film. By way of an example, the metal-nonmetal compound film 181 is a tantalum oxide film, and the metal-rich metal-nonmetal compound film 182 is tantalum-rich tantalum oxide film.

In some embodiments, the thickness of the multi-layered film 18 is greater than 1200 angstroms. In some embodiments, the thickness of the multi-layered film 18 is greater than 1800 angstroms. In some embodiments, the thickness of the multi-layered film 18 is greater than 2000 angstroms. In some embodiments, the thickness of the multi-layered film 18 is greater than 3000 angstroms.

The concentration of the metal element in the metal-rich metal-nonmetal compound film 182 is greater than the concentration of the nonmetal element in the metal-rich metal-nonmetal compound film 182. In some embodiments, the concentration of the metal element in the metal-rich metal-nonmetal compound film 182 is greater than 50%. In some embodiments, the concentration of the metal element in the metal-rich metal-nonmetal compound film 182 is greater than 55%. In some embodiments, the concentration of the metal element in the metal-rich metal-nonmetal compound film 182 is greater than 60%. In some embodiments, the concentration of the metal element in the metal-rich metal-nonmetal compound film 182 is greater than 75%.

In some embodiments, the multi-layered film 18 encloses sidewalls 14S and covers a surface 14U of the second conductive layer 14. The multi-layered film 18 is configured to prevent the second conductive layer 14 from being corroded during successive operations. Since the multi-layered film 18 formed of metal-nonmetal compound films 181 and metal-rich metal-nonmetal compound films 182 is able to alleviate propagation of pinholes and grain boundaries, the multi-layered film 18 surrounding the second conductive layer 14 can provide substantive barrier and protection effect. In addition, since the metal-rich metal-nonmetal compound with higher amount of metal element has reduced resistance compared to metal-nonmetal compound with less amount of metal element, the multi-layered film 18 including the metal-nonmetal compound films 181 and the metal-rich metal-nonmetal compound films 182 has reduced resistance. In comparison with a single-layered thick metal-nonmetal compound layer, the multi-layered film 18 has lower resistance, resulting in improvement of electric characteristic.

Figure 7:
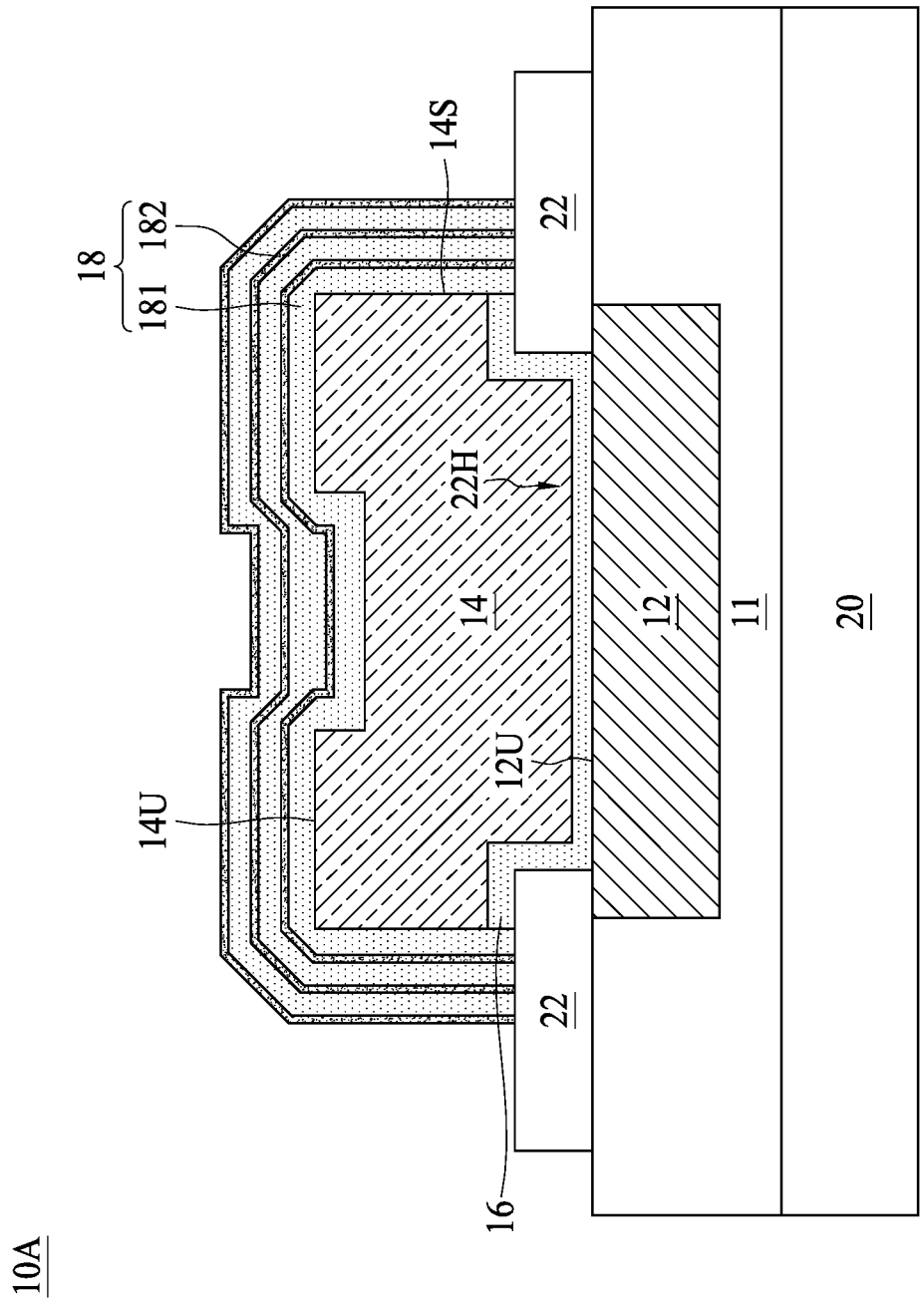
FIG. 7 is a schematic diagram illustrating a semiconductor device according to some embodiments of the present disclosure.

FIG. 7 is a schematic diagram illustrating a semiconductor device according to some embodiments of the present disclosure. As depicted in FIG. 7, one of the differences between the semiconductor device 10A in FIG. 7 and the semiconductor device 10 in FIG. 6 is that the surface 14U of the second conductive layer 14 is recessed. Accordingly, the multi-layered film 18 including the metal-nonmetal compound films 181 and the metal-rich metal-nonmetal compound films 182 is engaged into the recessed surface 14U, thereby enhancing adhesion between the multi-layered film 18 and the second conductive layer 14.

Figure 8:
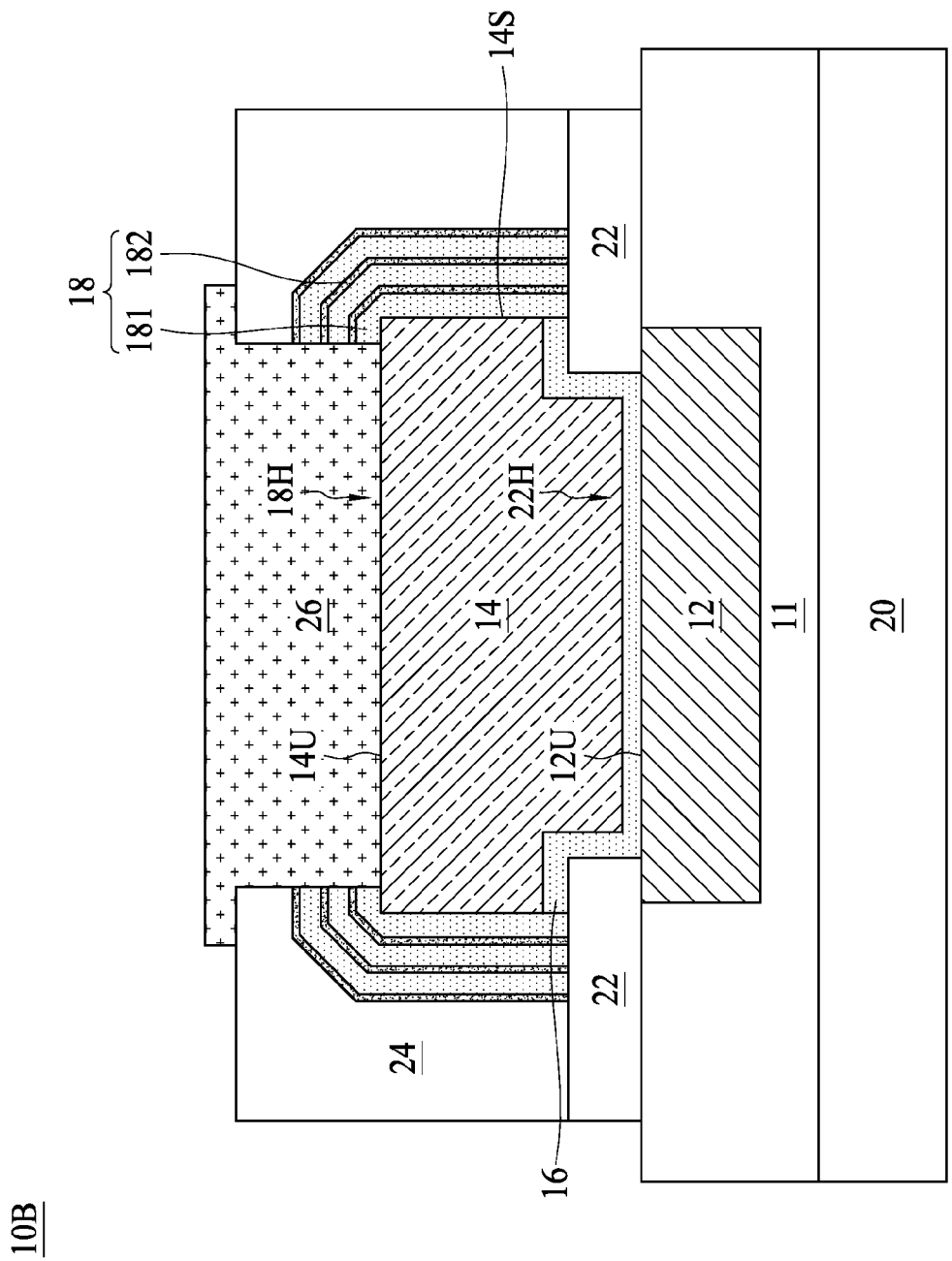
FIG. 8 is a schematic diagram illustrating a semiconductor device according to some embodiments of the present disclosure.

FIG. 8 is a schematic diagram illustrating a semiconductor device according to some embodiments of the present disclosure. As depicted in FIG. 8, in the semiconductor device 10B, a dielectric layer 24 is formed, surrounding a lateral side of the multi-layered film 18. The material of the dielectric layer 24 may include any suitable dielectric materials. The multi-layered film 18 has an opening 18U exposing at least a portion of the surface 14U of the second conductive layer 14. In some embodiments, a peripheral portion, which is proximal to the sidewall 14S of the second conductive layer 14, of the surface 14U is covered by the multi-layered film 18.

In some embodiments, the dielectric layer 24 and the opening 18H of the multi-layered film 18 may be, but are not limited to, patterned by the same photolithography operation. For example, the dielectric layer 24 and the multi-layered film 18 may be patterned by wet etching. As such, the multi-layered film 18 surrounding the sidewalls 14S of the second conductive layer 14 is configured to prevent the second conductive layer 14 from being corroded by etching or cleaning solutions.

In some embodiments, a portion of multi-layered film 18 is substantially extended along the sidewall 14S of the conductive layer 14. Such portion is configured as a spacer of to surround the sidewall 14S. The curvature or morphology of the portion is substantially following the curvature or morphology of the sidewall 14S. Therefore, the multi-layered film 18 provides a composite sidewall spacer around the sidewall 14S. The composite sidewall spacer is a metal containing structure.

The semiconductor device 10B further includes a conductor 26 over the second conductive layer 14, and electrically connected to the second conductive layer 14 through the opening 18H of the multi-layered film 18. In some embodiments, the conductive feature 26 may be a bonding pad, a conductive bump or any other conductive feature.

In some embodiments, the conductor 26 is partially surrounded by the multi-layered film 18. The surrounded portion of the conductor 26 is proximal to the surface 14U, which is also an interface between the conductor 26 and the second conductive layer 14.

Figure 9:
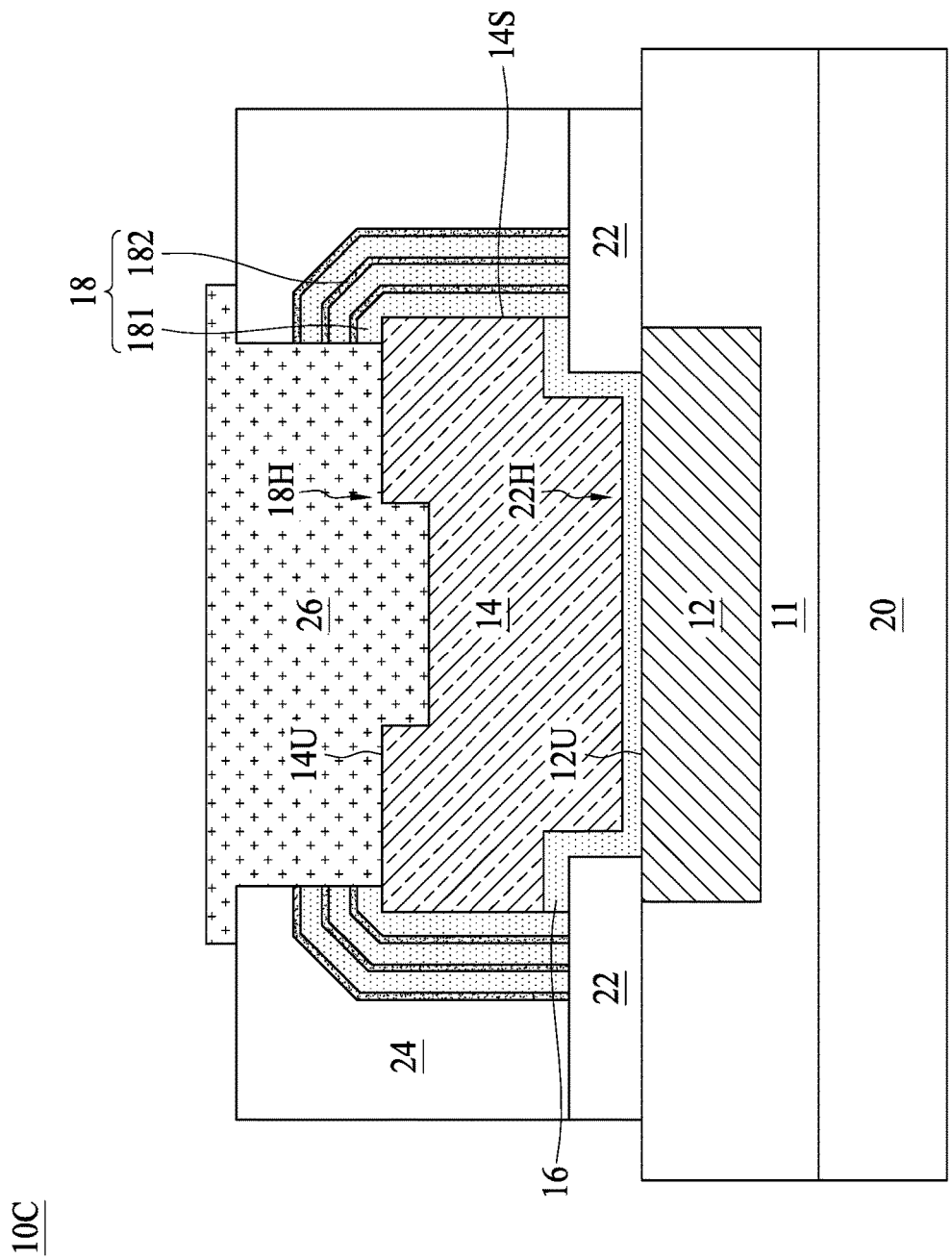
FIG. 9 is a schematic diagram illustrating a semiconductor device according to some embodiments of the present disclosure.

FIG. 9 is a schematic diagram illustrating a semiconductor device according to some embodiments of the present disclosure. As depicted in FIG. 9, one of the differences between the semiconductor device 10C in FIG. 9 and the semiconductor device 10B in FIG. 8 is that in the semiconductor device 10C, the surface 14U of the second conductive layer 14 is recessed. Accordingly, the conductor 26 is engaged into the recessed surface 14U, thereby enhancing adhesion between the conductor 26 and the second conductive layer 14.

Figure 10:
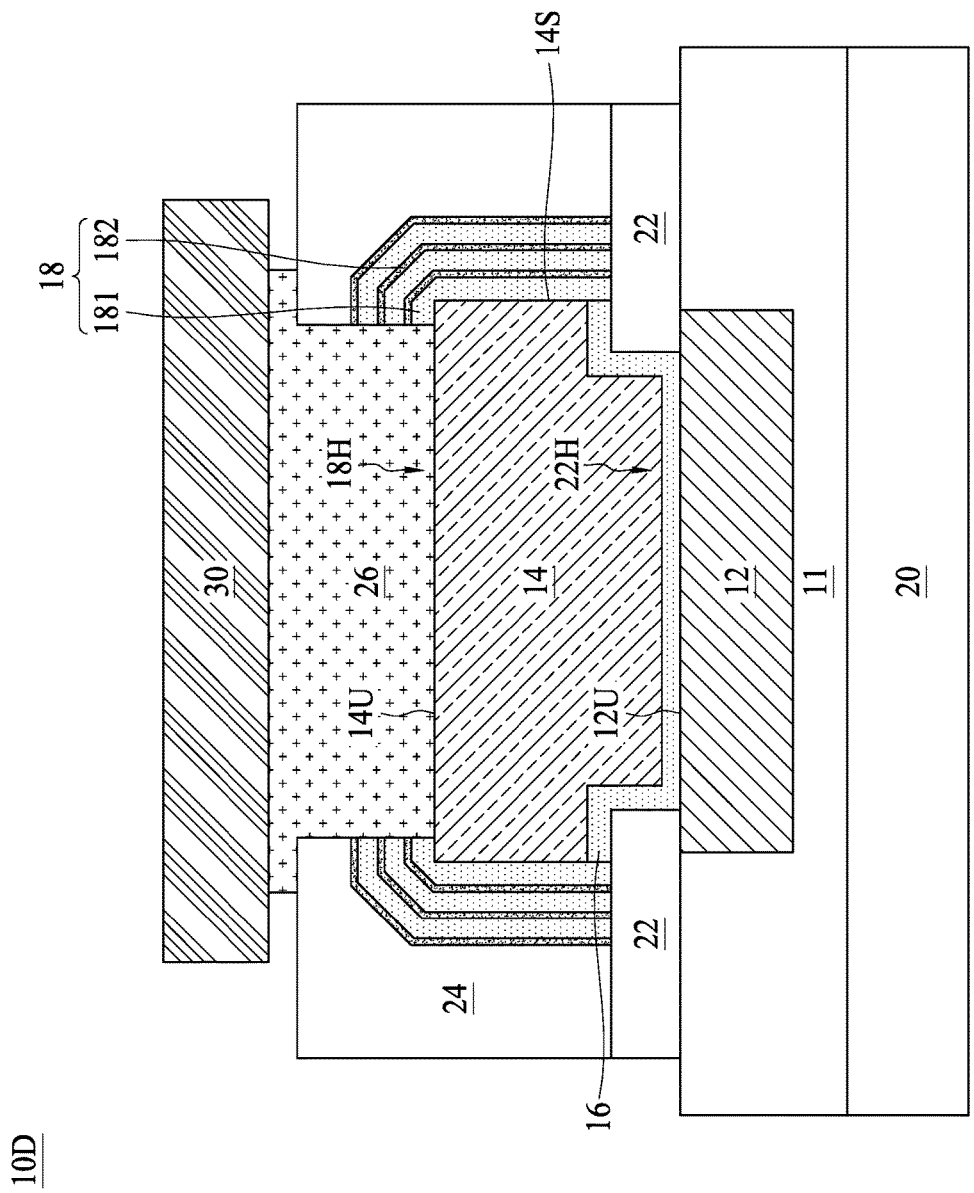
FIG. 10 is a schematic diagram illustrating a semiconductor device according to some embodiments of the present disclosure.

FIG. 10 is a schematic diagram illustrating a semiconductor device according to some embodiments of the present disclosure. As depicted in FIG. 10, the semiconductor device 10D further includes an electronic device 30. The electronic device 30 may include light-emitting device, IC chip, interposer, or any other suitable electronic devices. The electronic device 30 may be connected to the conductor 26 through flip chip bonding, wire bonding or any other suitable bonding methods.

In the present disclosure, the multi-layered film (film stack) including metal-nonmetal compound films and metal-rich metal-nonmetal compound films which are formed alternately in multi-stage deposition. The multi-layered film can provide pasting effect for particles, reduce stress to avoid peeling, reduce resistance to enhance electric characteristic, and improve barrier and protection effect.

In one exemplary aspect, a semiconductor device is provided. The semiconductor device includes a first conductive layer, a second conductive layer, a barrier layer and a multi-layered film. The first conductive layer is over a substrate. The second conductive layer is over and electrically connected to the first conductive layer. The barrier layer is between the first conductive layer and the second conductive layer. The multi-layered film encloses sidewalk of the second conductive layer, wherein the multi-layered film comprises a plurality of first metal-containing films and second metal-containing films alternately arranged to each other. The first metal-containing film and the second metal-containing film comprise the same metal element, and a concentration of the metal element in the second metal-containing film is higher than that in the first metal-containing film.

In another exemplary aspect, a film stack is provided. The film stack includes a plurality of first metal-containing films, and a plurality of second metal-containing films. The first metal-containing films and the second metal-containing films are alternately stacked to each other. The first metal-containing films and the second metal-containing films comprise the same metal element and the same nonmetal element, and a concentration of the metal element in the second metal-containing film is greater than 50%.

In yet another aspect, a method for forming a film stack on a substrate is provided. The method includes the following operations. (a) A first metal-containing film is formed over the substrate. (b) A second metal-containing film is formed over the first metal-containing film, wherein the first metal-containing film and the second metal-containing film comprise the same metal element, and a concentration of the metal element in the second metal-containing film is higher than that in the first metal-containing film. (c) Operations (a) and (b) are repeated to form a film stack of the first metal-containing films and the second metal-containing films alternately arranged until a desired thickness of the film stack is reached.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first conductive layer over a substrate;
a second conductive layer over and electrically connected to the first conductive layer;
a barrier layer between the first conductive layer and the second conductive layer;
a conductor over and electrically connected to the second conductive layer; and
a multi-layered film enclosing sidewalls of the second conductive layer, wherein the multi-layered film comprises a plurality of first metal-containing films and a plurality of second metal-containing films, wherein the pluralities of first and second metal-containing films are alternately arranged with each other, and wherein:
each film of the plurality of first metal-containing films includes a metal element and a nonmetal element, wherein each film of the plurality of first metal-containing films includes a first concentration of the metal element; and
each film of the plurality of second metal-containing films includes the metal element and the nonmetal element, and wherein each film of the plurality of second metal-containing films includes a second concentration of the metal element, wherein the second concentration is higher than the first concentration;
and wherein the plurality of the first metal-containing films and the plurality of second metal-containing films each interface the conductor.

2. The semiconductor device of claim 1, wherein the second concentration of the metal element in each of the plurality of second metal-containing films is greater than 75%.

3. The semiconductor device of claim 1, wherein the nonmetal element is nitrogen.

4. The semiconductor device of claim 1, wherein the metal element comprises tantalum, and the nonmetal element comprises nitrogen.

5. The semiconductor device of claim 1, wherein an overall thickness of the multi-layered film is greater than 1200 angstroms.

6. The semiconductor device of claim 5, wherein the overall thickness of the multi-layered film is greater than 2000 angstroms.

7. The semiconductor device of claim 1, wherein a material of the second conductive layer comprises copper or aluminum copper.

8. The semiconductor device of claim 1, wherein a portion of a surface of the second conductive layer is exposed by the multi-layered film.

9. The semiconductor device of claim 1, further comprising:
a dielectric layer formed on the multi-layered film, such that a top most layer of one of either the plurality of first metal-containing films or the plurality of second metal-containing films directly interfaces the dielectric layer.

10. The semiconductor device of claim 1, wherein the conductor is a bonding pad or conductive bump.

11. The semiconductor device of claim 1, wherein the plurality of first metal-containing films and the plurality of second metal-containing films each interface a passivation layer disposed on a top surface of the first conductive layer.

12. A semiconductor device, comprising:
a passivation layer over a first portion of a top surface of a first conductive layer;
a second conductive layer over a second portion of the top surface of the first conductive layer;
a plurality of first metal-containing films; and
a plurality of second metal-containing films, the first metal-containing films and the second metal-containing films being alternately stacked with each other,
wherein the first metal-containing films and the second metal-containing films comprise tantalum and nitrogen, and a concentration of the tantalum in each of the plurality of second metal-containing films is greater than 50% with respect to the nitrogen of the second metal-containing films, and a concentration of the tantalum in each of the plurality of first metal-containing films is less than 50% with respect to the nitrogen of the first metal-containing films;
wherein at least one film of the plurality of first metal-containing films and at least one film of the plurality of second metal-containing films each interface a top surface of the passivation layer and at least one film of the plurality of first metal-containing films or the plurality of second metal-containing films interfaces a sidewall of the second conductive layer.

13. A semiconductor device, comprising:
a first conductive layer on a substrate wherein the first conductive layer has a first sidewall and a second sidewall that opposes the first sidewall, and a top surface;
a multi-layer film including:
a first metal-containing film over the substrate and covering the first and second sidewalls of the first conductive layer, wherein the first metal-containing film extends over a portion of the top surface of the first conductive layer, wherein the first metal-containing film has a first metal element and a first concentration of the first metal element;
a second metal-containing film over the first metal-containing film, the second metal-containing film has the first metal element, and a second concentration of the first metal element, wherein the second concentration is higher than the first concentration;
a third metal-containing film over the second metal-containing film, wherein the third metal-containing film has the first metal element and the first concentration;
a fourth metal-containing film over the third metal-containing film, wherein the fourth metal-containing film includes the first metal element at the second concentration; and
a second conductive layer having a third sidewall and a fourth sidewall opposing the third sidewall, the second conductive layer disposed over the top surface of the first conductive layer, wherein each of the first, second, third, and fourth metal-containing films interface the second conductive layer.

14. The semiconductor device of claim 13, wherein the first metal-containing film and the second metal-containing film comprise tantalum nitride.

15. The semiconductor device of claim 13, wherein the first metal-containing film and the second metal-containing film comprise tantalum oxide films.

16. The semiconductor device of claim 13, wherein the top surface of the first conductive layer has a recess portion.

17. The semiconductor device of claim 16, wherein the second conductive layer is disposed directly on the recess portion.

18. The semiconductor device of claim 13, wherein the top surface of the first conductive layer includes a region free of the multi-layer film, and wherein the second conductive layer directly interfaces the region free of the multi-layer film.

19. The semiconductor device of claim 18, wherein the second conductive layer is a bonding pad or a conductive bump.

20. The semiconductor device of claim 13, further comprising:
a dielectric layer over the multi-layer film and interfacing a portion of the third and fourth sidewall of the second conductive layer.

* * * * *